United States Patent

Kienzler

[15] 3,678,502

[45] July 18, 1972

[54] METHOD FOR THE DIGITAL CONVERSION OF AN ANALOG VALUE WITH THE EXTENDED COUNTING PROCESS

[72] Inventor: Eberhard Kienzler, Karlsruhe, Germany

[73] Assignee: Siemens Aktiengesellschaft, Berlin, Germany

[22] Filed: March 23, 1970

[21] Appl. No.: 21,681

[30] Foreign Application Priority Data

March 24, 1970 Germany ......................P 19 14 916.7

[52] U.S. Cl. .............340/347 NT, 340/347 SH, 340/347 DA

[51] Int. Cl. ........................................................H03k 13/02

[58] Field of Search ...............340/347 AD, 347 NT, 347 SH; 320/1; 235/183; 324/111; 328/151

[56] References Cited

UNITED STATES PATENTS

| | | | |
|---|---|---|---|
| 3,059,228 | 10/1962 | Beck et al. | 340/347 SH |
| 3,439,272 | 4/1969 | Bailey et al. | 340/347 NT |
| 3,469,255 | 9/1969 | Hoffman et al. | 320/1 X |
| 3,525,093 | 8/1970 | Marshall | 340/347 AD |
| 3,480,948 | 11/1969 | Lord | 340/347 AD |

OTHER PUBLICATIONS

" Triple Play Sreeds A–D Conversion" by H. Bent Aasnae and Thomas J. Harrison; Electronics, April 29, 1968, pages 69–72.

" Four Ramp Integrating A– D Converter" by T. J. Harrison; IBM Technical Disclosure Bulletin, Vol. 11, No. 2, pages 191–192, July 1968.

*Primary Examiner*—Maynard R. Wilbur
*Assistant Examiner*—Joseph M. Thesz, Jr.
*Attorney*—Edwin E. Greigg

[57] ABSTRACT

In the digital conversion of an analog value with the extended counting method, the discharge of a first analog memory condenser is started one beat prior to the start of the discharge of a second or main analog condenser at a relatively strong current rate (coarse encoding). When the discharge voltage of the first memory condenser reaches the reference potential, the discharge of the main condenser at the relatively strong current rate is interrupted and its discharge continues at a relatively weak current rate until the reference potential is reached (fine encoding). The discharge of the main condenser is thus performed by a plurality of currents of different, but constant intensity, having a predetermined ratio and their number is equal to the number of steps in which the condenser is discharged.

10 Claims, 6 Drawing Figures

METHOD FOR THE DIGITAL CONVERSION OF AN ANALOG VALUE WITH THE EXTENDED COUNTING PROCESS

BACKGROUND OF THE INVENTION

In the digital conversion of an analog value according to the counting method, the voltage of a memory condenser is tracked by a time scanner during the period necessary to change the state of bringing it to a reference potential by means of a constant current. According to the extended counting method, the state of the memory condenser is changed in two successive steps with two currents of a predetermined ratio and each being of a different intensity. During the periods in which said change of state takes place, the counting pulses of the time scanner are counted with weighted values, the ratio of said weighted values being the same as that of the ratio of the current intensities.

As the extended counting method proceeds, the moment at which the change of state of the memory condenser with the stronger current is to be terminated and a further, partial change of state with the weaker current is to be started for an approximation of the reference potential is of particular importance. From said moment on, the pulses of the time scanner are counted with the smaller weight. The beginning of the change of state of the memory condenser with the stronger current is triggered by the time scanner, the more weighted counting pulses of which may be designated as coarse stages, whereas its less weighted counting pulses may be designated as fine stages. The change of state has to terminate in such a manner that the last coarse stage prior to reaching the reference potential is a completed one. Stated differently, after completion of the coarse encoding, the difference between the reference potential and the voltage of the condenser should not be greater than the change of condenser voltage for a single beat of the time scanner during the coarse encoding.

For the determination of the aforenoted essential moment two methods have been known heretofore.

According to one of these methods, a second reference potential is used which differs from the basic reference potential by one coarse stage. When the voltage of the memory condenser reaches the aforenoted second reference potential, then the immediately successive signal of the time scanner causes a termination of the change of state of the memory condenser with the stronger current and effects the starting of the partial recharge with the weaker current and, simultaneously, commands the start of counting the pulses of the time scanner with a correspondingly smaller weight.

The other method, although it needs only a single reference potential, requires opposing currents for changing the state of the memory condenser. During the coarse conversion, the voltage of the condenser changes its sign with respect to the reference potential and is, during its change of state with the weaker current of opposite direction, brought back to the reference potential. The less weighted pulses, too, have to be counted in a sense opposed to the count of the more weighted pulses.

The provision of two reference potentials as required by one of the known methods, or the provision of a current source and a current drain, the currents of which have a predetermined ratio, as required by the other known method, is encountered with certain difficulties.

Current sources and current drains are generally formed of controlled transistors of the type having opposed conductivity. In such a device, it is difficult to ensure a thermally synchronous operation for both types of transistors. Stated in other terms, the temperature curves of the two types of transistors are different and thus the ratio of currents of the current source and the current drain differ as a function of the temperature.

Another difficulty arises from the circumstance that in one of the known methods, the condenser has to be discharged and again partially charged during an encoding step. The inertia affecting the condenser during partial changes of state is felt substantially stronger in case the sense of the change of state is altered than in case of a mere slowinG down of the discharge step.

Furthermore, for the change of state of the condenser by means of two current sources of opposite poles, there are required two different supply voltages for the transistors of different conductivity representing the current sources. These voltages must have a synchronous curve if the current ratio of the sources is to be maintained at a constant value.

OBJECT, SUMMARY AND ADVANTAGES OF THE INVENTION

It is an object of the invention to provide an improved method of the aforenoted type using an extended counting process which requires only a single reference voltage and either current sources or current drains, thus eliminating the aforenoted disadvantages.

The invention relates to the analog-digital conversation according to the extended counting method by changing the state of an analog memory condenser in several codirectional steps. Said change of state is performed by a plurality of currents of different, but constant intensity having a predetermined ratio and their number is identical to the number of said steps. The periods of partial change of state are measured with counting pulses of a time scanner weighted in a ratio corresponding to that of the current intensities.

According to the invention, the moment to begin the partial change of state of a main analog memory condenser with the weaker current is determined with the aid of a logic circuit by means of a mark of the time scanner. Said mark follows the completion of a change of state of an additional or first analog memory condenser to the reference potential. The change of state of the first analog memory condenser is started one beat prior to the start of the partial change of state of the main analog memory condenser with the stronger current.

It is apparent from the foregoing that the method according to the invention permits the use of current sources of identical polarity and thus eliminates the afore-listed difficulties which are associated with the simultaneous use of a current source and a current drain. Also, the counter runs in one sense only, since, according to the invention, the change of state of the main condenser is preformed unidirectionally. Further, the method according to the invention uses a single reference voltage.

As noted hereinbefore, the state of the additional or first memory condenser is changed prior to changing the state of the condenser (also referred to as the second or main condenser) storing the signal to be encoded. When the voltage of the first memory condenser reaches the reference potential, the successive mark of the time scanner interrupts the change of state of the main condenser with the stronger current (coarse encoding) and a partial change of state with the weaker current (fine encoding) is started. The change of state of the first memory condenser starts one beat prior to starting the change of state of the main condenser with the stronger current (coarse encoding). The advance change of state of the first memory condenser renders unnecessary a second reference potential in a two-step process. The curve representing the change of state of the first condenser has to be linear only to the extent that the reference potential on the time axis is reached within a beat of the time scanner prior to the beginning of the fine encoding.

The method according to the invention may also be used for determining the breaking points of the voltage curves of one or several of a plurality of first analog memory condensers during a multi-step conversion process. The number of the additional or first analog memory condensers is dependent upon the number of steps $s$ of the extended counting process according to the invention and is determined by the formula:

$$\sum_{v=0}^{v=s-1} v$$

The above formula conventionally indicates that the sum of $v$ is taken and that $v$ is a series of numbers starting with zero and terminating with the numeral that is $s-1$, wherein s is the number of steps which bring the voltage of the main or second analog memory condenser to the reference potential.

The number of current sources or current drains for changing the state of all analog memory condensers is thus a function of the number of steps $s$ and is given by the partial sum of the $s^{th}$ member of an arithmetic series of the third order.

A third order arithmetic series, as it is well known from the study of series and progressions in mathematics, is composed in such a manner that the $s^{th}$ member of such series is determined by the formula $$A_s = A_0 + \binom{h}{1}\Delta A_0 + \binom{h}{2}\Delta^2 A_0 + \ . \ . \ . + \binom{h}{k}\Delta^k A_0$$

wherein $\Delta a_0 = a_1 - a_0$. Thus, an arithmetic series of the third order is used as a tool for determining the number of current sources (or current drains, as the case may be) as a function of the number of steps with which the main or second analog memory condenser is brought to the reference potential.

The invention will be better understood and further objects and advantages of the invention will become more apparent from the ensuing detailed specification of two exemplary embodiments taken i conjunction with the drawing.

In the two examples to be described, current drains are used; consequently, the change of state of the memory condensers is a discharge thereof towards a reference potential which is below the peak of the analog signal.

DESCRIPTION OF A FIRST EMBODIMENT UTILIZING A TWO-STEP PROCESS

Figure 1:
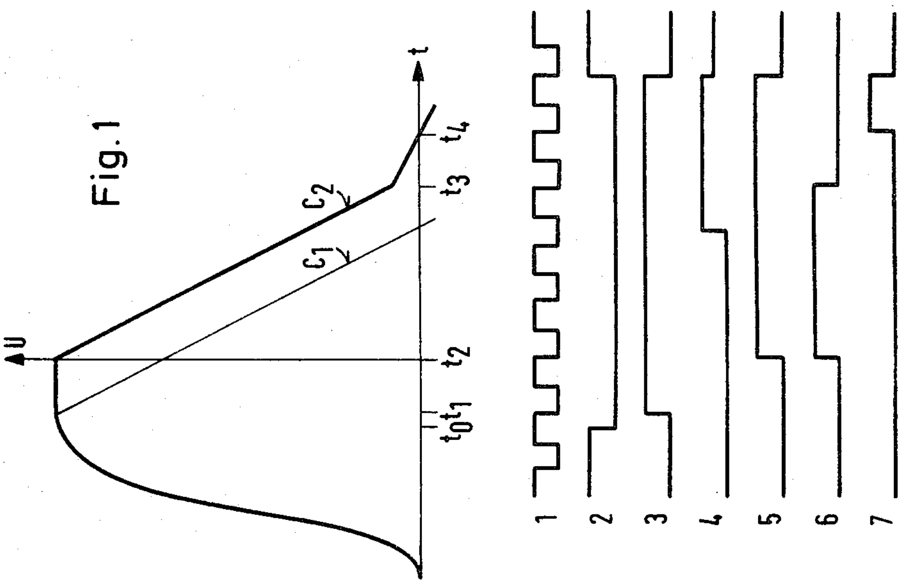
FIG. 1 is a diagram of voltage curves of two analog memory condensers in a two-step process and of the curves of the associated switching signals.

Turning now to the diagram shown in FIG. 1, the ordinate indicates the voltage at the terminals of two analog memory condensers $C_1$ and $C_2$, while the abscissa is the time axis which simultaneously represents a constant reference potential. The curve 1 of the switching signals represents the beats or pulses of a time scanner. The curves 2, 3, 5 and 6 are the control signals for switches $S_0 - S_3$. Curves 4 and 7 indicate the output voltages of null-indicators $NL_1$ and $NL_2$, respectively.

Figure 2:
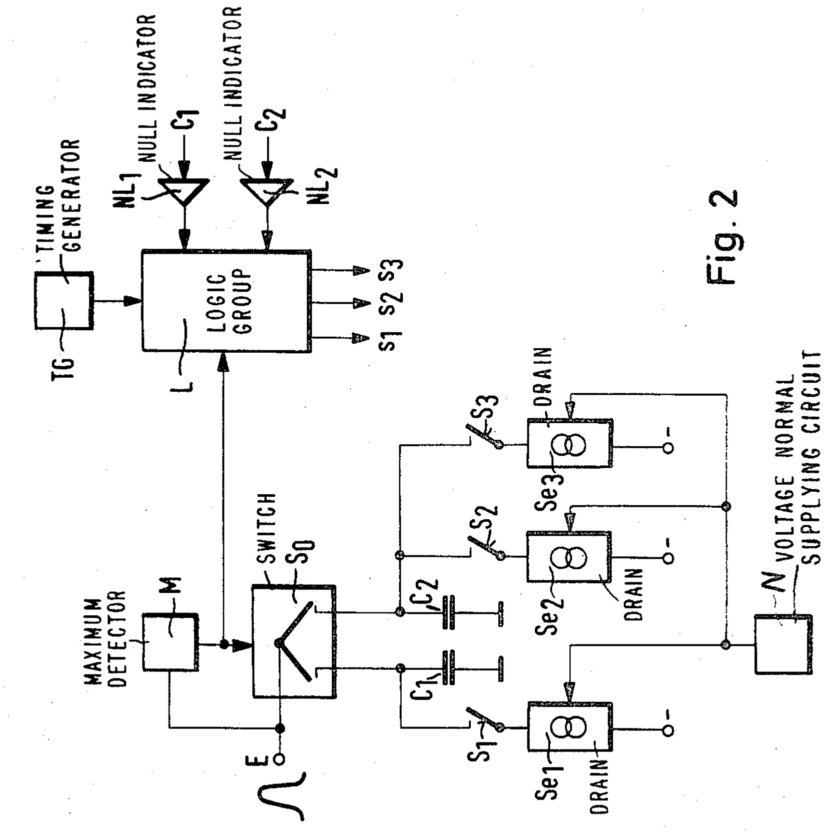
FIG. 2 is a circuit diagram for performing a two-step process according to the invention.

Turning now to FIG. 2, input terminal E of switch $S_0$ has applied thereto a voltage to be encoded, which may be, for example, an impulse voltage. The same voltage is applied simultaneously to a maximum detector M which may be a differentiating component. The output voltage of the maximum detector M serves to control the switch $S_0$ and a logic group L comprising a conventional gate structure. The output pulses of a timing generator TG are also applied to the logic group L. The logic group L emits signals $s_1$, $s_2$ and $s_3$ for the actuation of the respective switches $S_1$, $S_2$ and $S_3$, shown diagrammatically as single pole switches. The latter serve to connect a current drain $Se_1$ to a first memory condenser $C_1$ and two current drains $Se_2$ and $SE_3$ to the second or main analog memory condenser $C_2$. The current drains $Se_1 - Se_3$ are operably set to a constant level based on a common voltage normal supplied by a conventional transistor circuit N. The voltages appearing at the output of condenser $C_1$ and $C_2$ are applied through conductors, not shown, to two null-indicators $NL_1$ and $NL_2$, the output voltages of which are, in turn, fed into the logic group L.

OPERATION OF THE FIRST EMBODIMENT

The operation of the circuit shown in FIG. 2 will now be described in connection with the wave forms shown in FIG. 1.

Initially, switch $S_0$ is closed, while switches $S_1 - S_3$ are open, and the condensers $C_1$ and $C_2$ are charged through the switch $S_0$ which is part of a linear gate. At a time $t_0$, the impulse voltage applied to the input terminal E has reached its peak value and the peak is sensed by the maximum detector M. Thereupon, the maximum detector M generates a signal (wave form 2 of FIG. 1) which is applied to switch $S_0$ causing switch $S_0$ to open. At that moment, there is a voltage $U_x$ (the peak of the input voltage) to be encoded at the terminals of each condenser $C_1$ and $C_2$.

At time $t_1$, the trailing flank of a counting pulse (wave form 1 of FIG. 1) of the time scanner immediately following the moment $t_0$ appears, causing switch $S_1$ to be closed by a signal $s_1$ (wave form 3 of FIG. 1) from the logic group L. Closing of switch $S_1$ causes the condenser $C_1$ to be discharged through the current drain $Se_1$. The discharge voltage curve of the condenser $C_1$ is linear and has a rising negative slope corresponding to the coarse encoding (four fine stages per beat). Discharge of $C_1$ continues until the reference potential is reached represented by the zero line or abscissa. This point and the output of the time scanner control the moment $t_3$ at which switching is performed from the coarse encoding to the fine encoding.

The switching moment or time $t_3$ is determined by the trailing flank of a counting pulse of the time scanner that immediately follows the point in time when the reference potential is reached. Referring to FIG. 1, it will be seen from the curve for $C_2$ that the discharge of $C_2$ for both coarse and fine encoding is at a constant but different rate or intensity.

Switches $S_2$ and $S_3$ are closed at time $t_2$, one beat after the start of the discharge of condenser $C_1$ as illustrated by wave forms 5 and 6 of FIG. 1 corresponding to output signals $s_2$ and $s_3$, whereupon the two current drains $Se_2$ and $Se_3$ discharge the condenser $C_2$ with a current $i+(p-1)\cdot i=p\cdot i$. This equation means that the discharge current of the main or second analog memory condenser is formed of two currents, that is, current $i$ and current $(p-1)\cdot i$. The first-named current is taken up by the current drain $Se_2$, whereas the second current is taken up by the current drain $Se_3$. As indicated in line 11 of page 11, the sum of these two partial currents equals $p\cdot i$, wherein $p$ is a proportionality factor with which the counting pulses are weighted during discharge with higher current. The aforenoted discharge of the condenser $C_2$ continues until the condenser $C_1$ has reached the reference potential and the immediately successive trailing flank of a counting pulse has appeared. The value $p$ is the weight with which the counting pulses are counted in a counter, now shown, during the coarse encoding in the period from $t_2$ to $t_3$.

At time $t_3$, the switch $S_3$ is again opened due to the discontinuance of output signal $s_3$ (wave form 6 of FIG. 1) under the control of logic group L. Thereupon condenser $C_2$ discharges only with a current $i$, designating the start of fine encoding which terminates when the voltage at the condenser $C_2$ reaches the reference potential corresponding to time $t_4$. During the period from $t_3$ to $t_4$, the counting pulses of the time scanner are counted with a weight of 1.

The course of the discharge voltage of the condenser $C_1$ has to be accurate only to the extent that it reaches the reference potential during the beat of the time scanner preceding the moment $t_3$. The switching from coarse encoding to fine encoding is triggered at time $t_3$ by a signal emitted from a two input AND-circuit (not shown) contained in the logic group L. One input to the AND-circuit corresponds to reaching the reference potential by $C_1$, while the other input corresponds to the appearance of the trailing flank of a beat of the time scanner following the moment when the reference potential is reached.

The advantage of the afore-described method according to the invention resides in the fact that only current generators, for example, current drains, are required, the synchronous operation of which is easily achieved. Further, they may be controlled by the same reference voltage. Also, only a forward counting is required. Thus, there is no need for a counter adapted to be actuated by counting pulses proceeding in different counting senses.

DESCRIPTION OF A SECOND EMBODIMENT UTILIZING A THREE-STEP PROCESS

Figure 3:
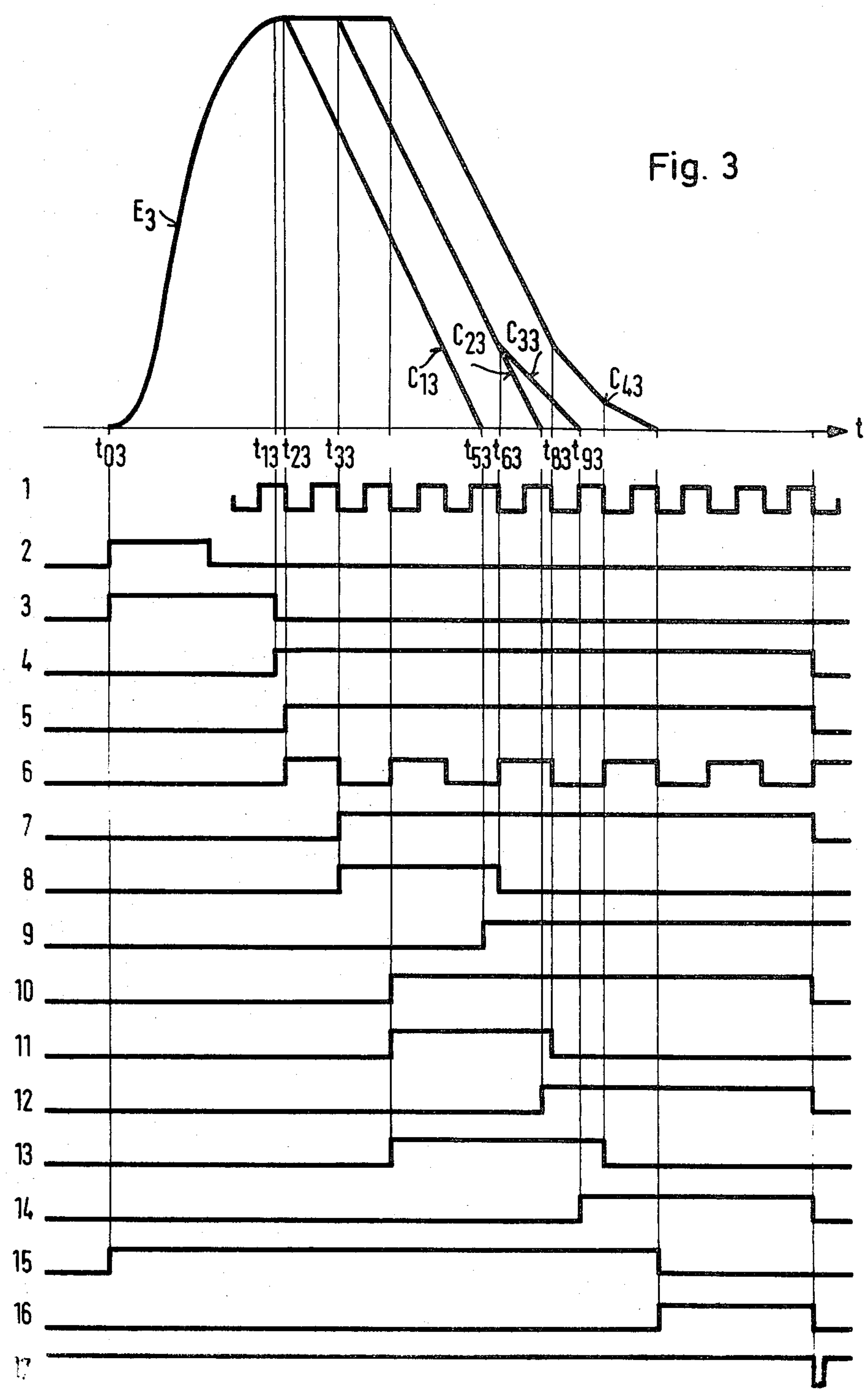
FIG. 3 is a diagram of voltage curves of three analog memory condensers in a three-step process and of the curves of the associated switching signals.

In FIG. 3 there is shown the course of the discharging voltages of analog memory condenser $C_{13}$, $C_{23}$, $C_{33}$ and $C_{43}$, together with the graphs of the associated control or switching signals which serve to control switches $S_{03} - S_{73}$ in a three-step encoding process.

Figure 4:
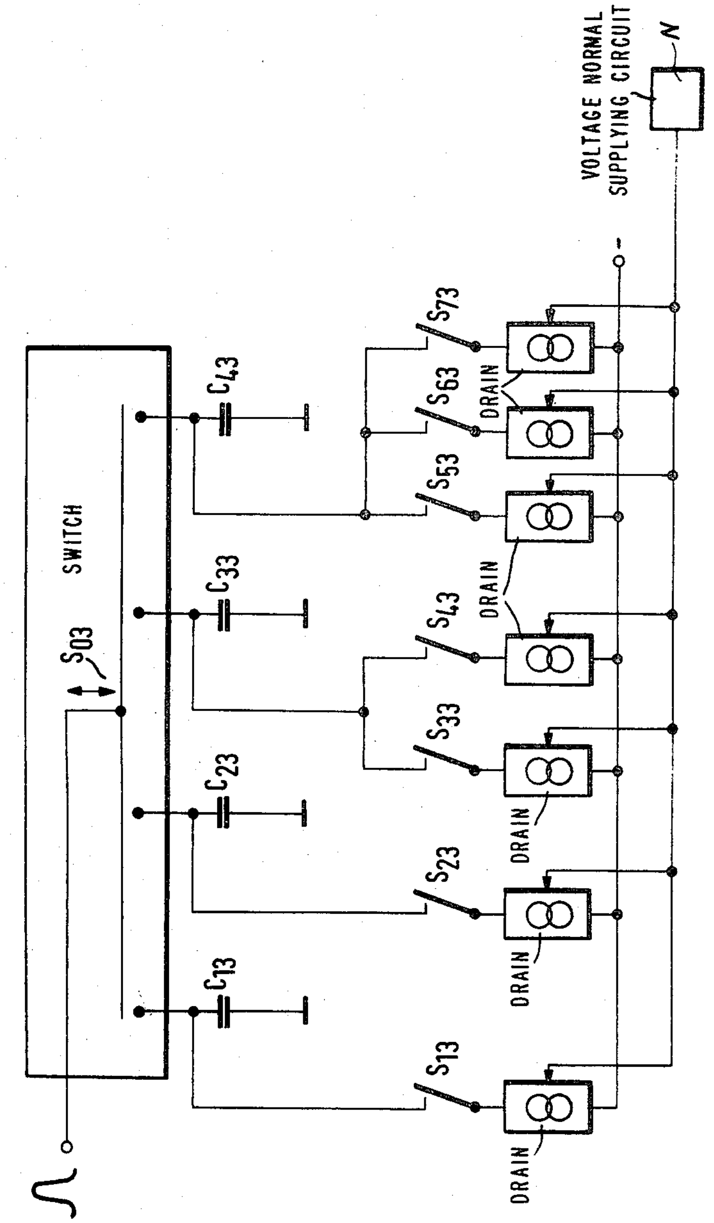
FIG. 4 is a circuit diagram for perForming a three-step process according to the invention.

In FIG. 4 there are shown the four analog memory condensers $C_{13} - C_{43}$ of the three step process together with eight switches $S_{03} - S_{73}$ and seven current drains. The condensers $C_{13}$, $C_{23}$ and $C_{33}$ by meanS of their discharge voltages, together with the output of beat generator $TG_3$ establish moments for controlling the discharge of the condenser $C_{43}$ in a manner similar to that described in connection with the two-step process.

Figures 5, 6:
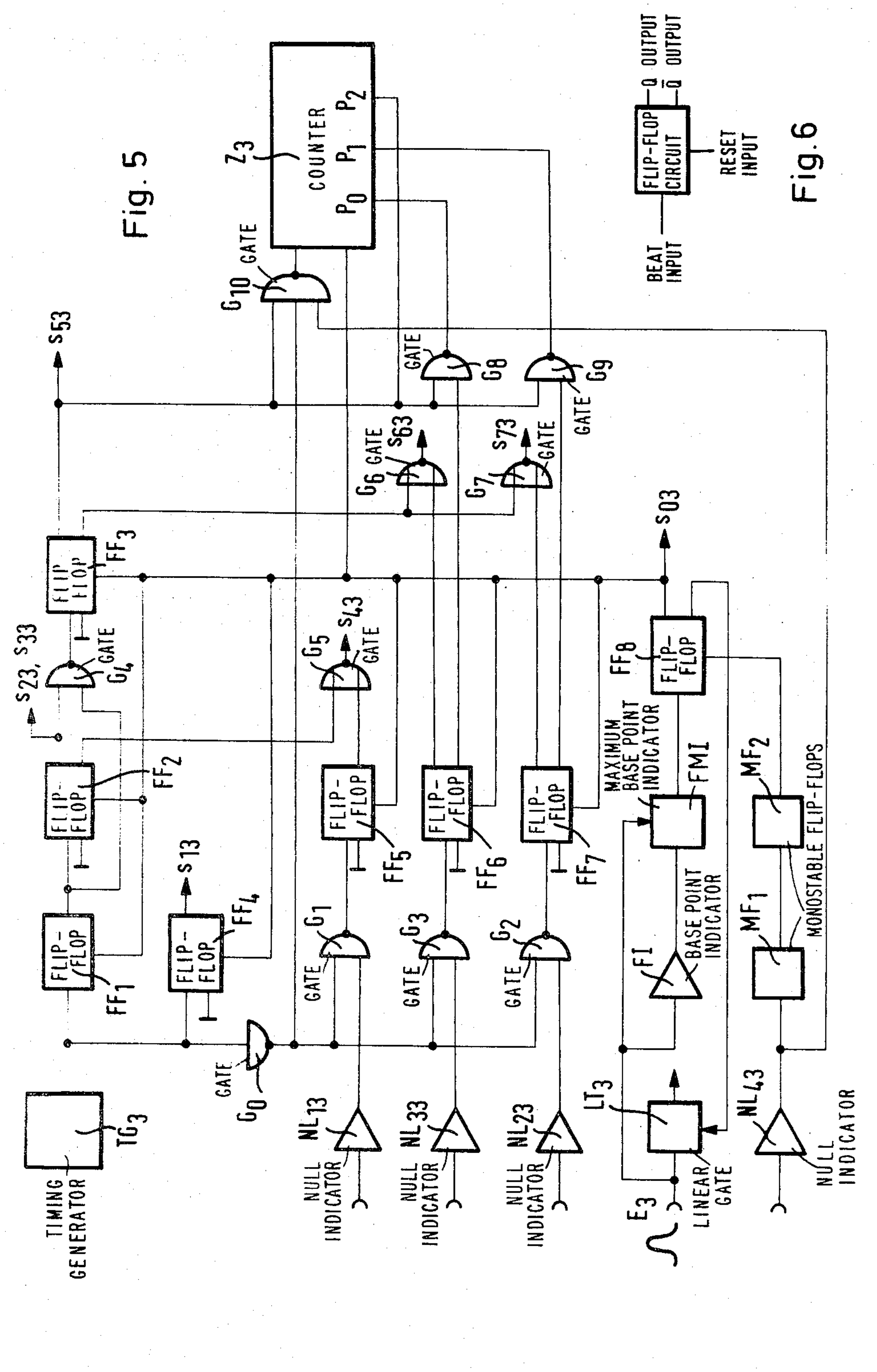
FIG. 5 is a diagram of an electronic logic circuit for controlling the switches and the pulse counter in a three step process.
FIG. 6 depicts the arrangement of terminals of the flip-flop circuits shown in FIG. 5 having one output designated Q and an inverse output designated $\overline{Q}$.

Referring to FIG. 5, there is shown an electronic logic circuit, one input terminal $E_3$ of which receives a signal pulse to be encoded. Four further input terminals are associated with null-indicators $NL_{13}$, $NL_{23}$, $NL_{33}$ and $NL_{43}$, respectively, for receiving the voltage of the four corresponding memory condensers $C_{13}$, $C_{23}$, $C_{33}$ and $C_{43}$, shown in FIG. 4.

The signal pulse proceeds from the input $E_3$ simultaneously to a linear gate $LT_3$ (which includes switch $S_{03}$), a base point indicator FI and to one input of a maximum base point indicator FMI. The linear gate $LT_3$ has an output which is connected with the charge input terminals of the four condensers $C_{13}$, $C_{23}$, $C_{33}$ or $C_{43}$ as illustrated in FIG. 4. A second input of the maximum base point indicator FMI is connected with the output of the base point indicator FI. The output signal of the maximum base point indicator FMI is applied to the beat input of a flip-flop circuit $FF_8$ functioning as a reducer.

The arrangement of terminals on the rectangle representing the flip-flop circuit $FE_8$ (as well as flip-flop circuits $FF_2$, $FF_3$, $FF_6$ and $FF_7$ to be discussed later) shown in FIG. 5, is depicted in FIG. 6. The Q output of the reducer $FF_8$ is connected with the reset inputs of a plurality of other flip-flop circuits, all of the master-slave type in this embodiment. The $\overline{Q}$ output of the reducer $FF_8$ is applied to a second input of the linear gate $LT_3$. As previously noted, switch $S_{03}$ of FIG. 4 is part of the linear gate circuit $LT_3$ and is opened by command of the $\overline{Q}$ output signal of the flip-flop circuit $FF_8$.

Beat generator $TG_3$ has its output connected to a reducing flip-flop circuit $FF_1$, the Q output of which is connected to the beat input of a second flip-flop circuit $FF_2$. The Q output of $FF_2$ generates signals $s_{23}$, $s_{33}$ for the control of switches $S_{23}$ and $S_{33}$, respectively, shown in FIG. 4. The $\overline{Q}$ output of flip-flop circuit $FF_2$ is connected to one input of a two-input gate $G_5$, having an output signal $s_{43}$ which controls switch $S_{43}$ of FIG. 4.

One input of an NAND gate $G_4$ is connected with the Q output of the flip-flop circuit $FF_2$, while the other input of the gate $G_4$ is directly connected with the Q output of the reducing circuit $FF_1$. The output of the gate $G_4$ is applied to the beat input of flip-flop circuit $FF_3$, the Q output signal $s_{53}$ of which controls the switch $S_{53}$ of FIG. 4. The $\overline{Q}$ output of the flip-flop circuit $FF_3$ is connected to one input of two, two input gates $G_6$ and $G_7$, the respective output signals $s_{63}$ and $s_{73}$ of which control the switches $S_{63}$ and $S_{73}$ of FIG. 4.

The output signals of the beat generator $TG_3$ are further applied to the beat input of flip-flop circuit $FF_4$, the Q output signal $s_{13}$ of which controls the switch $S_{13}$ of FIG. 4. The inverter outputs of the null-indicators $NL_{13}$, $NL_{33}$ and $NL_{23}$ are connected, respectively, with one input of two input NAND gates $G_1$, $G_3$, and $G_2$. The other inputs of the last-named three gates are connected to the output of a negation circuit $G_0$ which has its input connected to receive the output signal of the beat generator $TG_3$.

The respective outputs of the NAND gates $G_1$, $G_3$ and $G_2$ are connected with the beat inputs of three flip-flop circuits $FF_5$, $FF_6$ and $FF_7$. The Q output of the flip-flop circuit $FF_5$ is connected to a second input of the gate $G_5$ which has its other input connected to the $\overline{Q}$ output of flip-flop circuit $FF_2$. The Q output of the flip-flop circuit $FF_6$ is connected to a second input of the gate $G_6$ and the Q output of the flip-flop circuit $FF_7$ is connected to a second input of the gate $G_7$. The $\overline{Q}$ output of the flip-flop circuit $FF_6$ is applied to an input of an NAND gate $G_8$. The corresponding input of a second NAND gate $G_9$ is connected with the $\overline{Q}$ output of the flip-flop circuit $FF_7$. The two other inputs of the NAND gates $G_8$ and $G_9$ are connected with the Q output of the flip-flop circuit $FF_3$.

The respective outputs of gates $G_8$ and $G_9$ are connected with the control inputs $P_0$ and $P_1$ of a counter $Z_3$ to control the weight of the counting pulses. A third control input $P_2$ of the counter $Z_3$ is directly connected with the Q output of the flip-flop circuit $FF_3$, while the beat input of the counter $Z_3$ is connected with the output of a three input NAND gate $G_{10}$. To one input, serving as a starting input, there is connected the Q output of the flip-flop circuit $FF_3$; to a second input there is applied, through the negation circuit $G_0$, a signal corresponding to the beat or timing pulses of beat generator $TG_3$, while the third input of gate $G_{10}$ is connected with the output of null-indicator $NL_{43}$ which generates a signal when the voltage of the condenser $C_{43}$ of FIG. 4 has reached the reference potential. The third input of the gate $G_{10}$ thus serves as a stop input so as to cause the circuit to discontinue counting. The output of the null-indicator $NL_{43}$, with which the voltage of the main condenser $C_{43}$ proper is controlled, is applied to the input of a monostable flip-flop circuit $MF_1$. The output of $MF_1$ is coupled to the input of a second monostable flip-flop circuit $MF_2$. The output of $MF_2$ is, in turn, connected to the reset input of reducing circuit $FF_8$, the output of which controls the switch $S_{03}$.

OPERATION OF THE SECOND EMBODIMENT

The operation of the afore-described logic circuit will now be set forth with reference to FIGS. 3 and 4.

At time $t_{03}$ a signal pulse $E_3$ is generated, and the base point indicator FI is caused to emit an output signal (curve 2 in FIG. 3). Practically simultaneously therewith, the maximum base point indicator FMI also emits an output signal (curve 3 in FIG. 3), while all memory condensers $C_{13}$, $C_{23}$, $C_{33}$, $C_{43}$ begin to charge up through switch $S_{03}$ which is closed. At time $t_{13}$ the signal pulse reaches its maximum and all capacitors are charged. Thereupon, as seen, the output signal of the maximum base point indicator FMI is cut off. This switches the reducer flip-flop circuit $FF_8$. Its Q output signal $s_{03}$ (curve 4 in FIG. 3) is applied to flip-flop circuits $FF_1 - FF_8$ to cause the flip-flop circuits to assume a stand-by condition. The Q output signal of the flip-flop circuit $FF_8$ is applied to gate $LT_3$ so as to open switch $S_{03}$. Upon cut-off of the Q output signal of flip-flop circuit $FF_8$ at the end of the encoding cycle, all flip-flop circuits contained in the logic circuit are reset.

The first trailing flank of the beat signal (curve 1 in FIG. 3), following the moment $t_{13}$ and occurring at the moment $t_{23}$, closes the switch $S_{13}$ by means of the Q output signal $s_{13}$ (curve 5 in FIG. 3) of the flip-flop circuit $FF_4$. The reducing circuit $FF_1$ is also actuated by the trailing flank of the beat pulse appearing at moment $t_{23}$. The trailing flank of the Q output signal of the flip-flop circuit $FF_1$ actuates the flip-flop circuit $FF_2$ and the latter with its Q output signals $s_{23}$ and $s_{33}$, closes the respective switches $S_{23}$ and $S_{33}$ at moment $t_{33}$. Thus, the condensers $C_{23}$ and $C_{33}$ of FIG. 4 are discharged.

The Q output signals of the flip-flop circuits $FF_1$ and $FF_2$ are represented by curves 6 and 7, respectively, in FIG. 3. At moment $t_{33}$, the signal taken from the $\bar{Q}$ output of the flip-flop circuit $FF_2$ closes the switch $S_{43}$ through the gate $G_5$ by means of an output signal $s_{43}$ (curve 8 in FIG. 3). The switch $S_{43}$ is reopened at the moment $t_{63}$ by means of the first trailing flank of the beat signal following the moment $t_{53}$. This moment is determined by the null-indicator $NL_{13}$ which emits a signal when the voltage of the condenser $C_{13}$ has reached the reference potential. Said last-named signal is applied through the gate $G_1$ to a flip-flop circuit $FF_5$ which, in response, emits an output signal (curve 9 in FIG. 3) applied to the gate $G_5$. Meanwhile, through flip-flop circuit $FF_2$, a leading flank of the output signal of the reducer $FF_1$ as actuated the gate $G_4$ which, in turn, energizes the flip-flop circuit $FF_3$, at the Q output of which there appears a signal $s_{53}$ (curve 10 in FIG. 3) which closes the switch $S_{53}$ of FIG. 4. Simultaneously, the $\bar{Q}$ output signal of the flip-flop circuit $FF_3$ is applied to gates $G_6$ and $G_7$ which emit output signal $s_{63}$ (curve 13) and $S_{73}$ (curve 11), respectively, closing the associated switches $S_{63}$ and $S_{73}$. At this point the flip-flop circuit $FF_7$ is energized by the null-indicator $NL_{23}$ through the gate $G_2$, and generates at its Q output and output signal (curve 12 in FIG. 3) which affects the gate $G_7$ in such a manner that upon the appearance of the successive trailing flank of the beat signal at moment $t_{83}$, it cuts off the output signal $S_{73}$ of the gate $G_7$ and, as a result, the switch $S_{73}$ is opened.

The flip-flop circuit $\bar{FF_6}$ is actuated in response to the presence of an output signal at the output of null-indicator $NL_{33}$ when the voltage of condenser $C_{33}$ reaches the reference potential at moment $t_{93}$ to generate a signal (curve 14 in FIG. 3) at its Q output which is applied to gate $G_6$. This causes output signal $s_{63}$ of gate $G_6$ to be cut off as soon as the successive trailing flank of the beat signal appears.

The output signals at the $\bar{Q}$ output terminals of the flip-flop circuits $FF_6$ and $FF_7$ control simultaneously the respective weight inputs $P_0$ and $P_1$ of the counter $Z_3$ through gates $G_8$ and $G_9$. The output signal (curve 15 in FIG. 3) of null-indicator $NL_{43}$ controls the monostable flip-flop circuits $MF_1$ and $MF_2$ which cause a reset signal to be applied to the reducing circuit $FF_8$. The output signals of the monostable flip-flop circuits $MF_1$ and $MF_2$ are represented by curves 16 and 17, respectively. As soon as the reset signal is received at $FF_8$, its Q output causes flip-flop circuits $FF_1$ – $FF_7$ of the logic circuit to be reset, indicating the completion of an encoding cycle.

SUMMARY OF THE SPECIFICATION

The specification discusses two embodiments; the first one, illustrated in FIGS. 1 and 2, practices the invention in its simplest form, i.e., it discloses a two-step process, while the second embodiment illustrated in FIGS. 3 and 4 deals with a three-step process.

The first embodiment contains a sole additional or first analog memory condenser $C_1$ and a sole main or second analog memory condenser $C_2$.

The second embodiment is evidently more complex, since here a three-step process is practiced, necessitating a substantial increase in the number of condensers.

In the first embodiment a clear line can be drawn that separates the mode of operation of the first condenser $C_1$ and the second condenser $C_2$. Clearly, the additional or first condenser $C_1$ is discharged by the relatively strong current to the reference potential while the main or second condenser $C_2$ undergoes a two-step discharge, one with the relatively strong current up to moment $t_3$ and thereafter a second with a weak current.

The aforedescribed clear difference in operation is less apparent in the more complex second embodiment where a total of four condensers are present. Here the number of the additional or first analog memory condensers is more than one, while the number of the main or second analog memory condenser is still one and is identified as $C_{43}$. It is noted that in the second embodiment a number of first or additional analog memory condensers behave during operation similarly to the main or second analog memory condenser $C_2$ of the first embodiment.

It is noted that the term "change of state" is intended to cover either a charging or a discharging of the condensers. In both exemplary embodiments discharging takes place, this is why current drains and not current sources are described.

Examples will now be given to calculate, with the aid of formula $$\sum_{v=0}^{v=s-1} v$$

the number of first analog memory condensers when the number of steps in the process is known.

Thus, the first embodiment concerns a two-step process, consequently $s=2$ and therefore $v=0, 1$.

The second embodiment is a three-step process, thus $s=3$ and consequently, $v=0, 1, 2$.

Thus, since in the first embodiment $v=0, 1$ it follows that $\Sigma\, v = 0 + 1 = 1$. This result is confirmed since in the first embodiment there is one first analog memory condenser $C_1$.

Since in the second embodiment $v=0, 1, 2$, $\Sigma\, v = 0 + 1 + 2 = 3$. Again, this result is confirmed since the embodiment as shown in FIG. 4 has three first analog memory condensers $C_{13}$, $C_{23}$ and $C_{33}$.

That which is claimed is:

1. In a method for the digital conversion of an analog value by the extended counting process, said method being of the known type wherein the change of state of an analog memory condenser for bringing the voltage thereof to a reference potential is effected in a plurality of successive codirectional steps with a plurality of currents equalling the number of said steps, said currents having a constant, differing intensity of predetermined ratio, the timing of the changes of state of said analog memory condenser being effected with beats of a time scanner, said beats being weighted in a ratio identical to that of said current intensities, the improvement comprising the following steps:

A. bringing the voltage of a plurality of analog memory condensers to the analog value to be encoded, B. changing the state of a first analog memory condenser with a relatively strong current bringing the voltage of said first analog memory condenser to a predetermined value, C. changing the state of a second analog memory condenser towards said reference potential with said relatively strong current, D. terminating step (C) in a timed relation to the attainment of said predetermined voltage value by said first analog memory condenser, and E. changing the state of said second analog memory condenser towards said reference potential with a relatively weak current, starting step (E) simultaneously with step (D).

2. A method as defined in claim 1, wherein said predetermined voltage value is identical to said reference potential.

3. A method as defined in claim 1, wherein step (C) is started subsequent to the start of step (B).

4. A method as defined in claim 1, wherein step (C) is started by the beat of said time scanner immediately following the start of step (B).

5. A method as defined in claim 2, wherein step (D) and the start of step (E) are effected by the beat of said time scanner immediately following the attainment of reference potential by the voltage of said first analog memory condenser.

6. A method as defined in claim 1, wherein at least steps (C) – (E) are triggered by a logic circuit.

7. A method as defined in claim 1, wherein at least two first analog memory condensers are used, the moment of terminating the change of state of at least one first analog memory condenser with a relatively strong current and continuing a change of state of the last named condenser with a relatively weak current is determined by means of said method.

8. A method as defined in claim 7, wherein the number of said first analog memory condensers is determined by the formula $$\sum_{v=0}^{v=s-1} v$$

wherein $s$ is the number of steps for bringing the voltage of said second analog memory condenser to said reference potential.

9. A method as defined in claim 8, wherein the number of means necessary to cause current flow for changing the state of said condensers is the $s^{th}$ member of an arithmetic series of the third order.

10. A method as defined in claim 9, wherein said means necessary to cause current flow are current drains.

* * * * *

PO-1050
(5/69)

UNITED STATES PATENT OFFICE
CERTIFICATE OF CORRECTION

Patent No. 3,678,502 Dated July 18, 1972

Inventor(s) Eberhard Kienzler

It is certified that error appears in the above-identified patent and that said Letters Patent are hereby corrected as shown below:

In the heading, under [30] Foreign Application Priority Data, the date should read --March 24, 1969--.

Col. 2, line 3, "slowinG" should reading --slowing--; line 20, "conversation" should read --conversion--; line 44, "preformed" should read --performed--.

Col. 3, line 28, "i" should read --in--; line 43, "perForming" should read --performing--; line 75, "$SE_3$" should read --$Se_3$--.

Col. 4, line 61, "now" should read --not--.

Col. 5, line 27, "meanS" should read --means--; line 50 "$FE_8$" should read --$FF_8$--.

Col. 6, line 63, "Q" should read --$\overline{Q}$--.

Col. 7, line 17, "as" should read --has--.

Signed and sealed this 2nd day of January 1973.

(SEAL)
Attest:

EDWARD M. FLETCHER, JR.
Attesting Officer

ROBERT GOTTSCHALK
Commissioner of Patents